United States Patent [19]

Juna et al.

[11] 4,001,150

[45] Jan. 4, 1977

[54] COMPOSITION FOR PREPARING ELECTROCONDUCTIVE RESIN COMPRISING AN UNSATURATED POLYESTER AND PHOSPHORIC OR SULFONIC UNSATURATED ESTER

[75] Inventors: Kiyoshi Juna; Koji Ohdan; Hiroyuki Nakayama; Kiyohiko Asada, all of Hiratsuka, Japan

[73] Assignee: Kansai Paint Co., Ltd., Japan

[22] Filed: Dec. 6, 1974

[21] Appl. No.: 530,148

Related U.S. Application Data

[62] Division of Ser. No. 201,991, Nov. 24, 1971, Pat. No. 3,867,351.

[30] Foreign Application Priority Data

Nov. 25, 1970 Japan ........................... 45-103328
Dec. 25, 1970 Japan ........................... 45-118132

[52] U.S. Cl. .............................. 260/17 R; 204/181; 260/76; 260/884; 260/79.3 MU; 526/277
[51] Int. Cl.² ..................... C07F 9/08; C08L 1/10; C08L 1/26; C08L 1/32
[58] Field of Search ................ 260/17, 86.1 E, 76, 260/486 R, 30.4 R, 884

[56] References Cited

UNITED STATES PATENTS

| | | | |
|---|---|---|---|
| 2,308,236 | 1/1943 | Pollack | 526/71 |
| 2,409,633 | 10/1946 | Kropa | 526/277 |
| 2,465,999 | 4/1949 | Anderson et al. | 73/188 |
| 2,636,027 | 4/1953 | Coover et al. | 526/278 |
| 3,186,974 | 6/1965 | Verberg | 526/75 |
| 3,449,303 | 6/1969 | Caldwell et al. | 526/277 |
| 3,855,364 | 12/1974 | Steckler | 526/277 |
| 3,867,351 | 2/1975 | Juna et al. | 260/77.5 |

*Primary Examiner*—Edward M. Woodberry
*Attorney, Agent, or Firm*—Ostrolenk, Faber, Gerb & Soffen

[57] ABSTRACT

A composition for preparing an electroconductive resin with excellent properties of electrical conductivity, resistance to organic solvent, mechanical strength, adhesiveness and film forming property, and said composition consisting of at least:

alkylene phosphoric esters, alkylene phosphate esters, alkylene sulfonic esters or alkylene sulfonate esters of acrylic acid or methacrylic acid; and
a polyfunctional unsaturated compound having two to four polymerizable ethylenically unsaturated groups;
and, if necessary, further containing a polymeric material as a film-forming agent and/or a polymerizable ethylenically unsaturated compound; and/or a polymerization initiator.

10 Claims, No Drawings

COMPOSITION FOR PREPARING ELECTROCONDUCTIVE RESIN COMPRISING AN UNSATURATED POLYESTER AND PHOSPHORIC OR SULFONIC UNSATURATED ESTER

This is a division of application Ser. No. 201,991, filed on Nov. 24, 1971, now U.S. Pat. No. 3,867,351.

This invention relates to compositions for preparing electroconductive resins.

Further, the invention relates to the compositions used to prepare novel electroconductive resins each having good electric conductivity, resistance to organic solvent, mechanical properties, adhesive property and film forming property.

A superior electroconductive resin has long been looked for in order to prepare good electroconductive paper. In the prior art, a method is well known in which a resin consisting of polymerized vinyl benzyl quaternary ammonium compound is dispersible in water, and thereafter the medium, water, is vaporized to obtain an electroconductive film on a substrate. However, selection of reaction conditions to obtain reaction products free from gelation is very difficult, therefore the obtained products are very expensive. Furthermore, the obtained electroconductive film has very low electric conductivity, such as $1 \times 10^8$ to $1 \times 10^9$ ohms in the surface specific resistance and $1 \times 10^8$ to $1 \times 10^9$ ohms-cm in the volume specific resistance in air having a relative humidity of about 50%. Still more, the electrical conductivity of the product is largely dependent upon change of the relative humidity. For example, the surface specific resistance of such electroconductive film in air having a relative humidity of about 30% becomes $1 \times 10^9$ to $1 \times 10^{10}$ ohms which is as much as ten to a hundred times as large as the aforementioned value. Further, resistance to organic solvent and mechanical properties are inferior becasue such film is formed by means of the evaporation of the solvent used.

Accordingly, the object of the present invention is to remove the above-mentioned disadvantages of the ordinarily known electroconductive resin. In other words, the object of the invention is primarily to provide a composition for preparing electroconductive resins with good electrical conductivity. Further the object of the invention is to provide a composition from which a novel and superior electroconductive resin can be prepared very easily and economically, in which resistance of organic solvent, the mechanical properties and the adhesive property of the obtained film therefrom are excellent, and the time required for the film forming step is short.

As the result of the extensive studies on the above-mentioned objects, the inventors of the present invention have accomplished the objects of the invention.

That is, the composition of the present invention essentially comprises (A) alkylene phosphoric esters, alkylene phosphate esters, alkylene sulfonic esters or alkylene sulfonate esters of acrylic acid or methacrylic acid, and (B) polyfunctional unsaturated compound having two or more polymerizable ethylenically unsaturated groups. The composition of the present invention further comprises, (C) polymeric materials as a film-forming agent which is miscible with the above-mentioned (A) and (B) components, (D) polymerizable ethylenically unsaturated compounds and/or (E) polymerization initiators.

The alkylene phosphoric ester or alkylene phosphate ester of acrylic acid or methacrylic acid is represented by the following general formula:

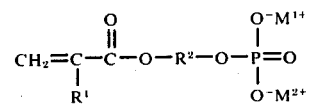

or

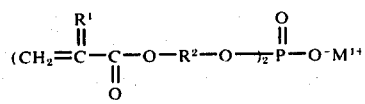

and the alkylene sulfonic ester of alkylene sulfonate ester of acrylic acid or methacrylic acid is represented by the following general formula:

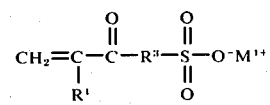

in which $R^1$ is hydrogen or a methyl group, $R^2$ is an alkylene group having 1 to 4 carbon atoms, $R^3$ is an alkylene group having 1 to 5 carbon atoms, and each of $M^1$ and $M^2$ is hydrogen, a monovalent metal, ammonium or monoamine. $M^1$ and $M^2$ are not necessarily the same. These esters of this invention can be used singly or as a mixture. The term "alkylene" referred to herein means a divalent saturated hydrocarbon or a divalent halogen substituted saturated hydrocarbon.

The alkylene phosphoric esters of acrylic acid and methacrylic acid which may be used for the composition of the present invention are, for example, phosphoric ethylene acrylate, phosphoric ethylene methacrylate, phosphoric trimethylene acrylate, phosphoric isopropylene methacrylate, phosphoric trimethylene methacrylate, phosphoric tetramethylene methacrylate, phosphoric 1-chloromethylethylene methacrylate, phosphoric-bis—ethylene acrylate), phosphoric-bis—ethylene methacrylate), phosphoricbis—trimethylene acrylate), phosphoric-bis—isopropylene methacrylate), phosphoric-bis—trimethylene methacrylate), phosphoric-bis—tetramethylene acrylate), and phosphoric-bis—tetramethylene methacrylate). If the number of carbon atoms in the alkylene groups of the above compounds is more than four, the reactivity of the ethylenically unsaturated group of the ester is lowered, and the film forming property may almost be lost.

As for the alkylene sulfonic esters of acrylic acid and methacrylic acid which can be used for the composition of the present invention, for example, sulfomethylene acrylate, sulfoethylene acrylate, sulfoethylene methacrylate, sulfotrimethylene acrylate, sulfoisopropylene acrylate, sulfotrimethylene methacylate, sulfotetramethylene acrylate, sulfobutylene methacrylate, and sulfopentamethylene acrylate are noted. If the number of carbon atoms in the alkylene groups of the above compounds is more than five, the reactivity of the ethylenically unsaturated group of the esters is lowered and the film-forming property may also be lost.

The alkylene phosphate esters can be prepared by neutralizing the alkylene phosphoric esters with inorganic or organic bases. In like manner, the alkylene sulfonate ester may be obtained by neutralizing the alkylene sulfonic esters with inorganic or organic bases.

The above-described neutralization can be carried out by using monovalent metallic bases, for example, sodium hydroxide, lithium hydroxide, potassium hydroxide and silver perchlorate.

Further, ammonia, alphatic monoamines and cyclic monoamines can be used for the neutralization. For example, monomethylamine, dimethylamine, trimethylamine, monoethylamine, diethylamine, triethylamine, n-butylamine, monoethanolamine, diethanolamine and triethanolamine as aliphatic monoamines; and pyridine, aniline, morpholine, and piperidine as aromatic monoamines, are exemplified. These bases can be used alone or as a mixture of them.

This neutralization may be carried out by means of the known method. The amount of the above-mentioned esters to be used for the composition is in the range of 5 to 95% by weight, and preferably in the range of 10 to 70% by weight.

As for the polyfunctional unsaturated compounds each having two or more polymerizable ethylenically unsaturated groups which can be used for the composition of the present invention, unsaturated urethane compounds each having two or more ethylenically unsaturated groups which are prepared from ethylenically unsaturated compounds each having one hydroxyl group and polyisocyanate compounds each having two or three isocyanate groups or addition products of polyisocyanate compounds each having two or three of isocyanate groups with polyhydric alcohols each having two to four of hydroxyl groups; unsaturated polyesters which are prepared from ethylenically unsaturated compounds each having one carboxyl group and polyhydric alcohols each having two to four hydroxyl groups; N,N'-alkylene-bis—acryl amides), in which alkylene group is methylene or ethylene, N,N'-alkylene-bis—methacryl amides) in which alkylene group is methylene or ethylene, dimaleimide and diallyl esters of dicarboxylic acids are exemplified.

It the above-mentioned polyfunctional compounds are not used in the composition, the compostion cannot be polymerized, accordingly and, the electroconductive film cannot be obtained. The amount of the polyfunctional unsaturated compounds used for the composition of the present invention may be in the range of 5 to 95% by weight, and preferably in the range of 30 to 90% by weight.

The ethylenically unsaturated compounds each having one hydroxyl group for the preparation of the above-mentioned unsaturated urethane compounds used for the composition of the invention are allyl alcohol, methallyl alcohol and N-methylol acrylamide, those which are represented by the following general formula:

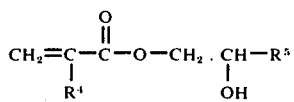

in which each of $R^4$ and $R_5$ are hydrogen or methyl group respectively. The above compounds are hydroxyalkyl esters of acrylic acid or methacrylic acid, for example, one member or a mixture of two or more of the group comprising of 2-hydroxyethyl acrylate, 2-hydroxypropyl acrylate, 2-hydroxyethyl methacrylate and 2-hydroxypropyl methacrylate.

As for the polyisocyanate compounds, one member or a mixture of two or more of the group comprising, for example, tolylene diisocyanate, diphenylmethane diisocyanate, xylene diisocyanate, hexamethylene diisocyanate, pentamethylene diisocyanate, naphthylene-1,5-diisocyanate, 3,3'-dimethyldiphenyl-4,4'-diisocyanate and polymethylene polyphenylene isocyanate, can be used.

The isocyanate compounds (e.g. hexamethylene diisocyanate) in which two isocyanate groups react at the same or nearer the same rate cause the gelation by cross-linking reaction of diisocyanate compounds with polyhydric alcohols. Therefore, such diisocyanate compounds must be used by mixing other polyisocyanate (e.g. tolylene diisocyanate, polymethylene polyphenylene isocyanate) in which one of the isocyanate groups reacts with a hydroxyl group at a much greater rate than does its other isocyanate group.

The addition reaction of hydroxyl group with isocyanate group may be carried out by means of well-known methods, in which the materials are used in such ratio that 1.0 equivalent of the isocyanate group is caused to react with 0.67 to 1.0 equivalent of the hydroxyl group of the hydroxyalkyl esters.

Further, as for the polyhydric alcohols, one member or a mixture of two or more of the group comprising, for example, ethylene glycol, diethylene glycol, triethylene glycol, neopentyl glycol, polyethylene glycol, triethylene glycol, neopentyl glycol, propylene glycol, polypropylene glycol, trimethylol propane, glycerin and pentaerythritol can be used. These polyhydric alcohols improve the film-forming property, and, in addition, they control the intermolecular cross-linking density to improve the mechanical property of the film formed. The reaction of these alcohols with isocyanates may be carried out by means of the known methods.

In the case of preparing the unsaturated urethane compounds by using the polyhydric alcohols, the materials are used in such ratio that 1.0 equivalent of hydroxyl group of polyhydric alcohols is caused to react with more than 1.0 equivalent of the isocyanate group, and then the residual isocyanate groups is caused to react with the same equivalent of the hydroxyl group of the hydroxyalkyl esters.

As for the ethylenically unsaturated compounds having one carboxyl group for obtaining the unsaturated esters which are used for the composition of the invention, one member or a mixture of two or more of the group comprising, for example, acrylic acid, methacrylic acid, α-chloroacrylic acid and α-bromoacrylic acid can be used. Meanwhile, as for the polyhydric alcohols each having two to four of hydroxyl groups for the preparation of the esters, one member or a mixture of two or more of the group comprising, for example, ethylene glycol, diethylene glycol, triethylene glycol, polyethylene glycol, neopentyl glycol, propylene glycol and polypropylene glycol as dihydric alcohols, trimethylol propane and glycerin as trihydric alcohols, and pentaerythritol as a tetrahydric alcohol, can be used. The esterification may be carried out by means of the well-known method, in which the materials are used in such ratio that 1 equivalent of the carboxyl group is caused to react with 1 to 2 equivalents of the hydroxyl group.

The number of carbon atoms of the alkylene groups contained in N,N'-alkylene bis (acrylamides) or N,N'- alkylene bis (methacrylamides) as the polyfunctional unsaturated compound is 1 to 2, and one or a mixture of two or more of the group comprising, for example, N,N'-methylene bis (acrylamide), N,N'-methylene bis (methacrylamide), N,N'-ethylene bis (acrylamide) and N,N'-ethylene bis (methacrylamide) may be used.

Further, the allyl compounds as the polyfunctional unsaturated compound for the composition of the invention may be one member or a mixture of two or more of the group comprising, for example, diallyl phthalate, diallyl maleate and diallyl succinate.

The mixture of the compounds of the above-mentioned groups can also be used as the polyfunctional unsaturated compounds of the invention.

Furthermore, polymeric materials as a film-forming agent can be used for the preparation of the composition of the invention in order to improve the film-forming property and appliability. These polymeric materials must be miscible with the alkylene phosphoric esters, alkylene phosphate esters, alkylene sulfonic esters or alkylene sulfonate esters, and the polyfunctional unsaturated compounds, and are used for the composition in the range of 20 to 130% by weight, preferably 30 to 110% by weight, based on total weight of alkylene phosphoric esters, alkylene phosphate esters, alkylene sulfonic esters or alkylene sulfonate esters and polyfunctional unsaturated compounds. These polymeric materials are effective to promote the physical properties of the electroconductive film, especially when are applied on paper or plastic film as a substrate. As such polymeric materials, for example, one member or a mixture of two or more of the group comprising polyvinyl alcohol, N-vinylpyridine copolymers, butyral resins, vinyl acetate copolymers, acrylic resin such as acrylic acid copolymers, methacrylic acid copolymers and 2-hydroxyethyl acrylate copolymers, cellulose derivatives such as cellulose acetate, cellulose acetate phthalate, ethyl cellulose acetate phthalate, ethyl cellulose, methyl cellulose and cellulose acetate -N,N'-di-n-butylaminohydroxy propyl ether.

Furthermore, ethylenically unsaturated compounds can be used for the preparation of the composition of the invention in order to improve the appliability, film-forming property and other film properties such as electric conductivity and flexibility of film formed. These unsaturated compounds must be miscible with the polyfunctional unsaturated compounds and the polymeric materials, and are used for the composition in the amount of not more than 40% by weight, preferably not more than 30% by weight based on the total weight of alkylene phosphoric esters, alkylene phosphate esters, alkylene sulfonic esters or alkylene sulfate ester and the polyfunctional unsaturated compounds. These ethylenically unsaturated compounds are effective to promote the cross-linking reaction of the polyfunctional unsaturated compounds with the esters of alkylene phosphoric esters, alkylene phosphate esters, alkylene sulfonic esters or alkylene sulfonate esters of acrylic acid or methacrylic acid. The ethylenically unsaturated compounds which are liquid or solid at the room temperature can be used. As such compounds, for example, one member or a mixture of two or more of the group comprising the vinyl monomers represented by the following three general formulas:

1. styrene and its derivatives

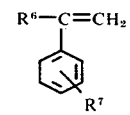

in which $R^6$ is hydrogen or methyl group and $R^7$ is hydrogen, methyl group or chlorine.

2. acrylic or methacrylic monomers

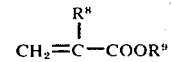

in which $R^8$ is hydrogen or methyl group and $R^9$ is hydrogen, alkyl group having 1 to 16 carbon atoms, hydroxyalkyl group having 2 to 3 carbon atoms, glycidyl group and dialkylamino alkyl group

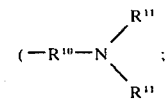

in which $R^{10}$ is alkylene group having 1 to 2 carbon atoms and $R''$ is an alkyl group of 1 to 2 carbon atoms;) and 3. vinylidene compounds

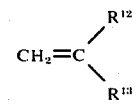

in which $R^{12}$ is hydrogen or methyl group and $R^{13}$ is nitrile group, carbamoyl group, N-methylolcarboamoyl group, alkylether-N-methylolcarbamoyl group ($-CONHCH_2OR^{14}$; in which $R^{14}$ is alkyl group having 1 to 4 carbon atoms) or acetoxy group.

Examples of vinyl monomers (1) are styrene, vinyl toluene, 2-methyl styrene and chlorostyrene.

Examples of vinyl monomers (2) are acrylic acid, methacrylic acid, methyl acrylate, methyl methacrylate, butyl acrylate, butyl methacrylate, 2-ethyl hexyl acrylate, 2-ethyl hexyl methacrylate, octyl acrylate, octyl methacrylate, lauryl methacrylate, 2-hydroxyethyl acrylate, 2-hydroxyethyl methacrylate, 2-hydroxypropyl acrylate, 2-hydroxypropyl methacrylate, glycidyl acrylate, glycidyl methacrylate, dimethylaminomethyl acrylate, dimethylaminoethyl methacrylate, diethylaminoethyl acrylate and diethylaminoethyl methacrylate.

Examples of vinyl monomers (3) are acrylonitrile, methacrylonitrile, acrylamide, methacrylamide, ethylether-N-methylol acrylamide, ethylether-N-methylol methacrylamide, butylether-N-methylol acrylamide, propylether-N-methylol methacrylamide and vinyl acetate.

In the polymerization reaction of the composition of the invention, if the polymerization is initiated by means of electron beam and ionizing radiation which have sufficient energy to initiate the polymerization reaction, the polymerization initiator is not necessary. However, in such case the polymerization initiator can be used without any trouble. In case the polymerization initiator is used for the composition of the invention, the amount thereof may be not more than 10% by weight, and preferably not more than 5% by weight based on the total weight of alkylene phosphonic esters, alkylene phosphate esters, alkylene sulfonic esters or alkylene sulfonate esters and the polyfunctional unsaturated compounds.

When the electroconductive resin film is formed from the composition of the invention by using heat rays, the ordinary free radical polymerization initiators, for example, organic peroxides (e.g. benzoyl peroxide, hydrogen peroxide, methyl ethyl ketone peroxide and di-tert-butyl peroxide) and organic azo-compounds (e.g. azobisisobutyro nitrile and α-azolbis-1-cyclohexane carbonitrile) are used, and when the energy source is actinic rays, the ordinary photo-sensitizers such as the organic peroxides (e.g. benzoyl peroxide, methyl ethyl ketone peroxide, hydrogen peroxide and di-tert-butyl peroxide), organic azocompounds (e.g. azobisisobutyronitrile and α-azobis-1-cyclohexane carbonitrile), organic sulfur compounds (e.g. diphenyl disulfide, tetramethylthiuram monosulfide, tetramethylthiuram disulfide and di-tert-butyl disulfide), organic carbonyl compounds (e.g. benzoin, benzoin ethyl ether, benzoin butyl ether, benzoin phenyl ether, anthraquinone, biacetyl, benzophenone, acetophenone and 9-bromoacetophenone) and metallic salts (e.g. uranyl nitrate, silver perchlorate and ferric chloride) can be used alone or in a mixtrue of two or more. These polymerization initiators are usually used in the range of 0.1 to 10.0% by weight, preferably 0.5 to 5.0% by weight, based on the total weight of alkylene phosphonic esters, alkylene phosphate esters, alkylene sulfonic esters of alkylene sulfonate esters and the polyfunctional unsaturated compounds.

When the electroconductive resin is produced from the composition of the present invention, it is sufficient only to expose the composition to heat rays, actinic rays or ionizing radiations. In heating, the temperature may be in the range of 50° to 150° C, and if it is lower than about 50° C, the cross-linking reaction cannot be brought about, and the film-foamed is obtained by heating in the temperature of higher than about 150°C. In case the actinic ray is irradiated to form the electroconductive resin, the composition is irradiated with the actinic ray in the range of 2500 to 6000 angstroms wave-length. Further, the resin can be obtained in a short period of time by the application of ionizing radiations such as gamma rays, electon beam, etc. Accordingly, the polymerization of the composition of the invention can be initiated by means of various methods.

The electric resistance of the resin obtained by cross-linking the composition is $1 \times 10^3$ to $1 \times 10^7$ ohms in the volume specific resistance and $1 \times 10^3$ to $1 \times 10^7$ ohms cm in the surface specific resistance in air having the relative humidity of 50%, and this value is from one-hundredth to one-hundred thousandth (1/100 – 1/100 000) compared with those of the prior known electroconductive resins. In addition, the electric resistance of the resin of the invention is not as dependent upon the changes of the relative humidity, that is, the value in air having the relative humidity of 30% is twice or at the most about 5 that at 50%.

In the preparation of the electroconductive resin from the composition of the present invention, the cross-linking reaction is caused by the exposure of the composition to the heat rays, actinic rays or ionizing radiation. Therefore the resistance to organic solvent and mechanical properties of the obtained resin are excellent compared with those of the ordinary solvent evaporation-drying type resins. Further, the film can be cured in a short period of time and the adhesive property of the film is also superior. Still further, the composition of the invention can be made by using several relatively low molecular weight compounds, and therefore, there is no fear of gelation, and such low molecular weight materials can be produced easily. Accordingly the cost of the composition of the invention is very low. Furthermore, the composition of the invention consists of relatively low molecular weight compounds, and therefore resins with wide variety of properties can be obtained by selecting the amounts and kinds of the components, and the electric conductivity of the resin can be made uniform. In the preparation of the electroconductive resin from the composition of the invention, if the actinic ray is irradiated through a patterned mask, the cured pattern having the electric conductivity can be formed by removing the unirradiated portion after the irradiation.

The electroconductive resin obtained from the composition of the invention is also entirely different in structure from those in the prior art. Therefore the effects of the resin are far better in several points which have never been expected. The composition of the present invention is especially suitable for coating material to provide electroconductive paper as well as many other uses.

In the following, the objects and features of the present invention will become more apparent in accordance with the Examples, which are intended as merely illustrative and in no way restrictive of the invention.

EXAMPLES 1 – 60

Mercury was placed in each Petri dish (10 cm in diameter and 1.5 cm in depth) to form a layer of mercury, and the compositions of Examples 1 to 60 as shown in Table 1, (a) to (f) were poured on each mercury layer, then each dish was covered and stood still for about one hour so as to remove the foams. In case the solvents were used in the compositions, the covers of the dishes were then taken off and the dishes were further stood still at the room temperature in order to remove the solvents.

The samples thus obtained were cured by the application of actinic rays or heat rays, then the thicknesses of the films, surface specific resistances and volume specific resistances were measured, the results of which are shown in Table 2, (a) to (c), inclusively.

In the curing step by irradiating actinic rays, a 400 W high-pressure mercury lamp H400P (made by Tokyo Shibaura Electric Co., Ltd.) was used at a distance of 50 cm apart from the surface layer of the composition, and the irradiation was continued until each composition was completely cured.

TABLE 1

| Example | A*1 | B*2 | D*3 | E*4 | Solvent |
|---|---|---|---|---|---|
| 1 | Phosmer-Cl (7.5g) | AUT-400E (2.5g) | — | — | Acetone (5.0g) |
| 2 | Phosmer-Cl (1.5g) | AUT-1000E (8.5g) | — | Benzoin ethyl ether (0.1g) | Acetone (5.0g) |

TABLE 1-continued

| | | | | | |
|---|---|---|---|---|---|
| 3 | Phosmer-Cl (1.5g) | AUT-400E (6.5g) | — | Benzoin (0.1g) | Acetone (5.0g) |
| 4 | Phosmer-Cl (3.5g) | AUT-400E (5.0g) | — | Tetramethyl thiuram monosulfide (0.1g) | Acetone (5.0g) |
| 5 | Phosmer-M (3.5g) | AUT-400E (6.5g) | — | Anthraquinone (0.1g) | Acetone (5.0g) |
| 6 | Phosmer-Cl (3.5g) | AUT-1000E (6.5g) | — | Benzoin peroxide (0.1g) | Acetone (5.0g) |
| 7 | Phosmer-M (1.5g) | AUT-1000E (8.5g) | — | Azobisisobutyronitrile (0.1g) | Acetone (5.0g) |
| 8 | Phosmer-Cl (5.0g) | AUT-100E (5.0g) | — | Benzoin ethyl ether (0.1g) | Acetone (5.0g) |
| 9 | Phosmer-Cl (7.5g) | NK-14G (2.5g) | — | Benzoin ethyl ether (0.1g) | Acetone (5.0g) |
| 10 | Phosmer-M (3.5g) | NK-23G (6.5g) | — | Benzoin (0.1g) | Acetone (5.0g) |
| 11 | Phosmer-M (5.0g) | NK-23G (4.0g) | Acrylic acid (1.0g) | Benzoin ethyl ethyer (0.1g) | Acetone (5.0g) |
| 12 | Phosmer-M (7.5g) | NK-14G (2.0g) | Acrylic acid (0.5g) | Benzoin ethyl ether (0.1g) | Acetone (5.0g) |
| 13 | Phosphoric tetramethylene methacrylate (3.5g) | AUT-1000E (6.5g) | — | Benzoin ethyl ether (0.1g) | Acetone (5.0g) |
| 14 | Phosmer-Cl (3.5g) | AUT-600E (5.2g) | Vinyl acetate (1.3g) | Benzoin ethyl ether (0.1g) | — |
| 15 | Phosmer-Cl (5.0g) | AUT-600E (4.0g) | Acrylic acid (1.0g) | Benzoin ethyl ether (0.1g) | — |
| 16 | Phosmer-M (3.0g) | AUT-600E (4.8g) | Ethyl acrylate (1.2g) SEA (1.0g) | Benzoin ethyl ether (0.1g) | — |
| 17 | Phosmer-Cl (7.5g) | AUX-600E (2.0g) | Ethyl acrylate (0.5g) | Anthraquinone (0.1g) | — |
| 18 | Phosmer-M (3.5g) | AUP-600E (5.2g) | Ethyl acrylate (1.3g) | Benzoin (0.1g) | — |
| 19 | Phosmer-M (5.0g)q | NK-23G (4.0g) | Acrylic acid (1.0g) | Azobisisobutyronitrile (0.1g) | Acetone (5.0g) |
| 20 | Silver salt of Phosmer-M (7.5g) | AUT-NPG (2.5g) | — | Benzoin ethyl ether (0.1g) | Acetone (5.0g) |
| 21 | Silver salt of Phosmer-M (7.5g) | AUT-1000E (1.0g) NK-23G (1.2g) | Acrylic acid (0.3g) | Benzoin ethyl ether (0.1g) | Acetone (5.0g) |
| 22 | Silver salt of Phosmer-M (3.0g) | AUT-2000E (1.6g) NK-23G (1.6g) | Acrylic acid (0.8g) Silver salt of SEA (3.0g) | Benzoin ethyl ether (0.1g) | — |
| 23 | Phosmer-Cl (3.5g) | Diallyl phthalate (6.5g) | — | Azobisisobutyronitrile (0.1g) | Tetrahydrofuan (5.0g) |
| 24 | Phosmer-M-TEA (5.0g) | AUT-400E (4.0g) | Ethyl acrylate (1.0g) | Benzoin ethyl ether | — |
| 25 | Phosmer-Cl (3.0g) | AUT-400E (6.5g) | SEM (0.5g) | Benzoin (0.1g) | Acetone (5.0g) |
| 26 | Phosmer-Cl (2.5g) | AUT-400E (5.2g) | Vinyl acetate (1.3g) SEM (1.0g) | Benzoin ethyl ether (0.1g) | — |
| 27 | Phosmer-M (2.5g) | AUT-1000E (5.2g) | Acrylamide (1.3g) | Anthraquinone (0.1g) | — |
| 28 | Phosmer-M-TEA (7.5g) | AUT-1000E (2.0g) | Vinyl acetate (0.5g) | Benzophenone (0.1g) | — |
| 29 | Phosphoric ethylene acrylate (5.0g) | AUT-400E (5.0g) | — | Benzoin ether (0.1g) | Acetone (5.0g) |
| 30 | Phosphoric bis-ethylene methacrylate (7.5g) | AUT-1000E (2.0g) | Ethyl acrylate (0.5g) | Benzoin ethyl ether (0.1g) | — |
| 31 | SEM (0.5g) | AUT-400E (4.5g) | — | — | Acetone (5.0g) |
| 32 | SEM (0.25g) | AUT-400E (4.75g) | — | — | Acetone (5.0g) |
| 33 | SEM (1.25g) | AUT-400E (3.75g) | — | — | Acetone (5.0g) |
| 34 | SEM (0.25g) | AUT-2000E (4.75g) | — | — | Acetone (5.0g) |
| 35 | SEM (0.75g) | AUT-400E (4.25g) | — | — | Acetone (5.0g) |
| 36 | SEM (0.25g) | AUT-1000E (4.75g) | — | Benzoin ethyl ether (0.05g) | Acetone (5.0g) |
| 37 | SEM (1.75g) | AUT-400E (3.25g) | — | Benzoin (0.05g) | Acetone (5.0g) |
| 38 | SEM (1.25g) | AUT-2000E (3.75g) | — | Tetramethyl thiuram monosulfide (0.05g) | Acetone (5.0g) |
| 39 | SEM (2.50g) | AUT-2000E (2.50g) | — | Benzoin ethyl ether (0.05g) | Acetone (5.0g) |
| 40 | SEM (5.00g) | AUT-400E (12.00g) | Ethyl acrylate (3.00g) | — | — |
| 41 | SEM (10.00g) | AUT-400E (8.00g) | Butyl acrylate (2.00g) | Benzoin ethyl ether (0.20g) | — |
| 42 | SEM (15.00g) | AUX-400E (4.00g) | Ethyl methacrylate (1.00g) | Benzophenone (0.20g) | — |
| 43 | SEM (5.00g) | AUT-1000E (12.00g) | Ethyl acrylate (3.00g) | Benzoyl peroxide (0.20g) | — |
| 44 | SEM (2.50g) | NK-4G (2.50g) | — | Benzoin ethyl ether (0.05g) | Acetone (5.0g) |
| 45 | SEM (1.25g) | NK-14G (3.75g) | — | Methylethyl ketone peroxide (0.05g) | Acetone (5.0g) |
| 46 | SEM (6.00g) | N,N'-methylene bismethacrylamide (9.60g) | Acrylic acid (2.40g) | Benzoin ethyl ether (0.2g) | — |
| 47 | SEA (3.00g) | AUT-600E (12.00g) | Ethyl acrylate (2.0g) Methyl methacrylate (3.0g) | Benzoin ethyl ether (0.2g) | — |
| 48 | SEM-TEA (5.0g) | AUT-1000E (12.0g) | Ethyl acrylate (3.0g) | Benzoin (0.2g) | — |

TABLE 1-continued

| Example | A*1 | B*2 | C*5 | D*3 | E*4 | Solvent |
|---|---|---|---|---|---|---|
| 49 | SBA (5.0g) | NK-14G (12.0g) | Vinyl acetate (3.0g) | Tetramethyl thiuram monosulfide (0.2g) | — | |
| 50 | SEM (3.0g) | Diallyl phthalate (13.6g) | Vinyl acetate (3.4g) | Azobisisobutyronitrile (0.2g) | — | |
| 51 | Silver salt of SEM (10.0g) | AUT-NPG (8.0g) | Butyl acrylate (1.0g) | Anthraquinone (0.2g) | — | |
| 52 | Potassium salt of SEM (8.0g) | AUT-NPG (10.0g) | Butyl acrylate (2.0g) | Anthraquinone (0.2g) | — | |
| 53 | SEM (2.5g) | AUT-1000E (3.5g) | CAP (4.0g) | — | Benzoin ethyl ether (0.1g) | Methyl ethyl ketone |
| 54 | Potassium salt of SEM (1.0g) SEM (3.0g) | AUT-400E (1.0g) AUP-600E (1.0g) | EC (6.0g) | — | Benzoin (0.1g) | Methyl ethyl ketone (40g) |
| 55 | Phosphoric tetramethylene methacrylate (4.0g) | NK-23G (3.0g) | VMCH (3.0g) | — | Benzoin ethyl ether (0.1g) | MEK (20g) Acetone (20g) |
| 56 | SEM (1.0g) | AUT-1000E (2.0g) AUT-NPG (2.0g) | BX-L (5.0g) | — | Benzoin (0.1g) | Acetone (40g) |
| 57 | SBM (3.5g) | AUT-1000E (0.5g) NK-14G (1.0g) | NVP (5.0g) | — | Anthraquinone (0.2g) | Acetone (20g) methyl alcohol (20g) |
| 58 | Phosphoric bis (ethylene acrylate) (5.0g) | NK-14G (1.0g) | CABP (4.0g) NVP (1.0g) | — | Benzoin (0.1g) | Acetone (40g) |
| 59 | SEM (1.0g) silver salt of SEM (1.0g) Triethyl phosphoric ethylene acrylate (1.0g) | NK-14G (2.5g) | AC (2.0g) HEMA (2.5g) | — | Benzoin ethyl ether (0.1g) | Acetone (10g) methanol (10g) |
| 60 | Potassium salt of phosmer-M (4.0g) | NK-14G (0.5g) | CAP (5.5g) | acrylamide (1.5g) | Benzoin (0.1g) | Acetone (10g) |

*1 The compounds as disclosed in the column A are alkylene phosphoric esters, alkylene phosphate esters, alkylene sulfonic esters or alkylene sulfonate esters as stated in the initial part of this specification. Each formula or formation of these compounds is further listed in the following Table 3.
*2 The compounds as disclosed in the column B are the aforementioned polyfunctional unsaturated compounds each of which having two to four of polymerizable ethylenically unsaturated groups. The details of these compounds are listed also in the following Table 3.
*3 The compounds as disclosed in the column D are the aforementioned polymerizable ethylenically unsaturated compounds, the details of which are also shown in the following Table 3.
*4 The compounds as disclosed in the column E are polymerization initiators.
*5 The compound as disclosed in the column C are the aforementioned polymeric materials, the details of which are also shown in the following Table 3.

TABLE 2

| Example | Light Irradiation (min) | Curing Heating (°C) | Curing Heating (min) | Film Thickness (mm) | Surface Specific Resistance (ohm) | Volume Specific Resistance (ohm·cm) |
|---|---|---|---|---|---|---|
| 1 | 20 | — | — | 0.85 | $3.3 \times 10^4$ | $6.0 \times 10^4$ |
| 2 | 3 | — | — | 0.74 | $2.3 \times 10^5$ | $3.2 \times 10^5$ |
| 3 | 3 | — | — | 0.94 | $2.3 \times 10^5$ | $2.1 \times 10^5$ |
| 4 | 4 | — | — | 0.84 | $5.3 \times 10^4$ | $8.1 \times 10^4$ |
| 5 | 2 | — | — | 0.80 | $5.0 \times 10^7$ | $9.8 \times 10^5$ |
| 6 | — | 80 | 30 | 0.67 | $5.1 \times 10^4$ | $1.0 \times 10^5$ |
| 7 | — | 80 | 30 | 0.85 | $1.7 \times 10^5$ | $2.0 \times 10^5$ |
| 8 | 2 | — | — | 0.86 | $3.6 \times 10^4$ | $6.4 \times 10^4$ |
| 9 | 2 | — | — | 0.75 | $3.3 \times 10^4$ | $6.5 \times 10^4$ |
| 10 | 3 | — | — | 0.77 | $5.7 \times 10^4$ | $9.4 \times 10^4$ |
| 11 | 2 | — | — | 0.67 | $4.1 \times 10^4$ | $8.1 \times 10^4$ |
| 12 | 2 | — | — | 0.71 | $4.2 \times 10^4$ | $7.8 \times 10^4$ |
| 13 | 5 | — | — | 0.88 | $2.1 \times 10^5$ | $1.9 \times 10^5$ |
| 14 | 2 | — | — | 0.82 | $1.2 \times 10^7$ | $5.2 \times 10^6$ |
| 15 | 2 | — | — | 0.79 | $3.1 \times 10^5$ | $2.7 \times 10^5$ |
| 16 | 2 | — | — | 0.82 | $1.5 \times 10^5$ | $2.6 \times 10^5$ |
| 17 | 2 | — | — | 0.77 | $3.3 \times 10^4$ | $3.2 \times 10^4$ |
| 18 | 3 | — | — | 0.92 | $2.8 \times 10^6$ | $1.2 \times 10^8$ |
| 19 | — | 60 | 60 | 0.65 | $1.7 \times 10^5$ | $1.4 \times 10^5$ |
| 20 | 2 | — | — | 0.98 | $7.8 \times 10^3$ | $1.1 \times 10^4$ |
| 21 | 1 | — | — | 0.76 | $8.9 \times 10^3$ | $8.6 \times 10^3$ |
| 22 | 2 | — | — | 0.78 | $6.8 \times 10^3$ | $7.9 \times 10^3$ |
| 23 | — | 80 | 60 | 0.77 | $1.2 \times 10^7$ | $5.2 \times 10^6$ |
| 24 | 5 | — | — | 0.70 | $1.5 \times 10^5$ | $1.8 \times 10^5$ |
| 25 | 5 | — | — | 0.91 | $5.0 \times 10^5$ | $2.6 \times 10^5$ |
| 26 | 5 | — | — | 0.89 | $1.2 \times 10^5$ | $1.5 \times 10^5$ |
| 27 | 3 | — | — | 0.84 | $1.5 \times 10^5$ | $2.2 \times 10^5$ |
| 28 | 5 | — | — | 0.79 | $3.6 \times 10^4$ | $7.3 \times 10^4$ |
| 29 | 3 | — | — | 0.87 | $4.9 \times 10^4$ | $6.6 \times 10^4$ |
| 30 | 2 | — | — | 0.92 | $2.5 \times 10^5$ | $7.7 \times 10^6$ |
| 31 | 20 | — | — | 0.32 | $7.7 \times 10^4$ | $2.2 \times 10^5$ |
| 32 | 20 | — | — | 0.33 | $2.3 \times 10^5$ | $4.0 \times 10^5$ |
| 33 | 20 | — | — | 0.35 | $4.2 \times 10^4$ | $1.1 \times 10^5$ |
| 34 | 8 | — | — | 0.30 | $3.1 \times 10^4$ | $1.7 \times 10^5$ |
| 35 | — | 80 | 60 | 0.32 | $4.9 \times 10^4$ | $2.1 \times 10^5$ |
| 36 | 5 | — | — | 0.48 | $5.0 \times 10^5$ | $4.3 \times 10^5$ |
| 37 | 5 | — | — | 0.30 | $3.5 \times 10^4$ | $1.0 \times 10^5$ |
| 38 | 8 | — | — | 0.45 | $3.6 \times 10^4$ | $1.1 \times 10^5$ |
| 39 | 8 | — | — | 0.32 | $3.1 \times 10^4$ | $1.6 \times 10^5$ |
| 40 | 25 | — | — | 1.55 | $3.8 \times 10^4$ | $3.7 \times 10^4$ |

TABLE 2-continued

| Example | Light Irradiation (min) | Curing Heating (°C) | Curing Heating (min) | Film Thickness (mm) | Electric Resistance[*6] Surface Specific Resistance (ohm) | Electric Resistance[*6] Volume Specific Resistance (ohm·cm) |
|---|---|---|---|---|---|---|
| 41 | 5 | — | — | 1.60 | $8.6 \times 10^3$ | $8.9 \times 10^3$ |
| 42 | 5 | — | — | 1.50 | $3.1 \times 10^4$ | $3.3 \times 10^4$ |
| 43 | — | 60 | 30 | 1.79 | $3.96 \times 10^4$ | $2.96 \times 10^4$ |
| 44 | 5 | — | — | 0.27 | $3.1 \times 10^4$ | $1.9 \times 10^5$ |
| 45 | — | 60 | 60 | 0.34 | $3.4 \times 10^4$ | $1.7 \times 10^5$ |
| 46 | 8 | — | — | 1.45 | $3.8 \times 10^4$ | $4.2 \times 10^4$ |
| 47 | 5 | — | — | 1.38 | $1.3 \times 10^4$ | $1.1 \times 10^4$ |
| 48 | 5 | — | — | 1.50 | $4.1 \times 10^5$ | $3.8 \times 10^5$ |
| 49 | 7 | — | — | 1.31 | $2.6 \times 10^4$ | $2.1 \times 10^4$ |
| 50 | — | 60 | 40 | 1.39 | $5.8 \times 10^5$ | $6.1 \times 10^5$ |
| 51 | 5 | — | — | 1.22 | $7.8 \times 10^3$ | $8.1 \times 10^3$ |
| 52 | 5 | — | — | 1.12 | $5.9 \times 10^5$ | $7.7 \times 10^5$ |
| 53 | 1 | — | — | 0.74 | $2.1 \times 10^5$ | $3.0 \times 10^5$ |
| 54 | 1 | — | — | 0.80 | $3.1 \times 10^5$ | $5.3 \times 10^5$ |
| 55 | — | 60 | 10 | 0.67 | $1.3 \times 10^6$ | $6.5 \times 10^6$ |
| 56 | 1 | — | — | 0.75 | $4.0 \times 10^6$ | $3.9 \times 10^6$ |
| 57 | 1 | — | — | 0.71 | $2.5 \times 10^6$ | $7.1 \times 10^6$ |
| 58 | 1 | — | — | 0.82 | $1.2 \times 10^5$ | $5.1 \times 10^5$ |
| 59 | — | 100 | 3 | 0.92 | $2.5 \times 10^6$ | — |
| 60 | — | 100 | 10 | 0.98 | $1.0 \times 10^6$ | — |

[*6]The surface specific resistance (ohm) and the volume specific resistances (ohm.cm) as shown in Table 2-(a) to Table 2-(c) were measured in accordance with ASTM D-257-61 by using electrode "Type TR-42" (made by Takeda Riken, Japan) for measuring the ultra-high electric resistance and an ammeter (made by Yokokawa Electric Works, Limited, Japan). The measurements were carried out at a temperature of 20° C and a relative humidity of 50%.

TABLE 3

| Abbreviation | Chemical Name | Structural formula etc. |
|---|---|---|
| Column A | | |
| Phosmer-M | Phosphoric ethylene methacrylate | $CH_2=C(CH_3)-C(=O)-O-CH_2-CH_2-O-P(=O)(OH)_2$ |
| Phosmer-Cl | Phosphoric-1-chloromethyl ethylene methacrylate | $CH_2=C(CH_3)-C(=O)-O-CH_2-CH(OPO_3H_2)-CH_2Cl$ |
| — | Phosphoric tetramethylene methacrylate | $CH_2=C(CH_3)-C(=O)-O-CH_2-CH_2-CH_2-CH_2-O-P(=O)(OH)_2$ |
| Silver salt of Phosmer-M Potassium salt of Phosmer-M-TEA | — | Obtained by neutralizing Phosmer-M with silver perchlorate, potassium hydroxide or triethyl amine (TEA), respectively. |
| — | Phosphoric ethylene acrylate | $CH_2=CH-C(=O)-O-CH_2-CH_2-O-P(=O)(OH)_2$ |
| — | Phosphoric bisethylene methacrylate | $[CH_2=C(CH_3)-C(=O)-O-CH_2-CH_2-O]_2P(=O)(OH)$ |
| SEM | 2-sulfoethylene methacrylate | |
| SEA | 2-sulfoethylene acrylate | |
| SEM-TEA | Triethylamine salt of 2-sulfoethylene methacrylate | |
| SBA | 4-sulfobutylene acrylate | |
| SEM | 4-sulfobutylene methacrylate | |

| Abbreviation | Chemical Name | Composition etc. | |
|---|---|---|---|
| Column B | | | |
| AUT-400E | — | Unsaturated urethane compound consisting of: | |
| | | 2-hydroxyethyl methacrylate | 1 mols, |
| | | tolylene diisocyanate | 2 mols, and |
| | | polyethylene glycol (m.w.=400) | 1 mol. |
| AUT-600E | — | Unsaturated urethane compound consisting of: | |
| | | 2-hydroxyethyl methacrylate | 2 mols, |
| | | tolylene diisocyanate | 2 mols, and |
| | | polyethylene glycol (m.w.=600) | 1 mol. |

TABLE 3-continued

| Abbreviation | | Structural formula etc. | |
|---|---|---|---|
| AUX-600E | — | Unsaturated urethane compound consisting of:<br>2-hydroxyethyl methacrylate<br>xylene diisocyanate<br>polyethylene glycol (m.w.=600) | 2 mols,<br>2 mols, and<br>1 mol. |
| AUP-600E | — | Unsaturated urethane compound consisting of:<br>2-hydroxyethyl methacrylate<br>diphenylmethane diisocyanate<br>polyethylene glycol (m.w.=600) | 2 mols,<br>2 mols, and<br>1 mol. |
| AUT-1000E | — | Unsaturated urethane compound consisting of:<br>2-hydroxyethyl methacrylate<br>tolylene diisocyanate<br>polyethylene glycol (m.w.=1000) | 2 mols,<br>2 mols, and<br>1 mol. |
| AUT-2000E | — | Unsaturated urethane compound consisting of:<br>2-hydroxyethyl methacrylate<br>tolylene diisocyanate<br>polyethylene glycol (m.w.=2000) | 2 mols,<br>2 mols, and<br>1 mol. |
| AUT-NPG | — | Unsaturated urethane compound consisting of:<br>2-hydroxyethyl methacrylate<br>tolylene diisocyanate<br>neopentyl glycol | 2 mols,<br>2 mols, and<br>1 mol. |
| NK-14G | — | Unsaturated ester consisting of:<br>polyethylene glycol (m.w.=630)<br>methacrylic acid | 1 mol, and<br>2 mols. |
| NK-23G | — | Unsaturated ester consisting of:<br>polyethylene glycol (m.w.=1000)<br>methacrylic acid | 1 mol, and<br>2 mols. |
| AUX-400E | — | Unsaturated urethane compound consisting of:<br>2-hydroxyethyl methacrylate<br>xylylene diisocyanate<br>polyethylene glycol (m.w.=400) | 2 mols,<br>2 mols, and<br>1 mol. |
| NK-4G | — | Unsaturated ester consisting of:<br>polyethylene glycol (m.w.=200)<br>methacrylic acid | 1 mol, and<br>2 mols. |

| Abbreviation | Chemical Name | Structural formula etc. |
|---|---|---|
| Column C | | |
| SEA | Sulfoethylene acrylate | $CH_2=\underset{\underset{H}{\mid}}{C}-\underset{\underset{O}{\parallel}}{C}-O-CH_2-CH_2-\underset{\underset{O}{\parallel}}{\overset{\overset{O}{\parallel}}{S}}-OH$ |
| Silver salt of SEA | — | Obtained by neutralizing SEA with using silver perchlorate |
| SEM | Sulfoethylene methacrylate | $CH_2=\underset{\underset{CH_3}{\mid}}{C}-\underset{\underset{O}{\parallel}}{C}-O-CH_2-CH_2-\underset{\underset{O}{\parallel}}{\overset{\overset{O}{\parallel}}{S}}-OH$ |

| Abbreviation | Chemical Name or Composition etc. |
|---|---|
| CAP | Cellulose acetate phthalate |
| EC | Ethyl cellulose |
| VMCH | Trade name: Vinyl chloride-vinyl acetate copolymer manufactured by Sekisui Chemical Co., Ltd., in Japan. |
| BX-L | Trade name: Butyral resin manufactured by Sekisui Chemical Co., Ltd., in Japan. |
| NVP | Copolymer of N-vinyl pyridine/Butyl methacrylate/Vinyl acetate = 50/25/25 |
| GABP | Cellulose acetate -N,N'-di-n-butylamino-hydroxy propyl ether. |
| Ac | Copolymer of Acrylic acid/Methyl methacrylate = 50/50. |
| HEMA | Copolymer of 2-hydroxyethylacrylate/Methyl acrylate/Butyl acrylate = 50/20/30. |

EXAMPLES 61 – 71

Glass plates were adhered with polyester films ("Tetoron" Trade name) and further provided with rubber-made frames. The compositions as disclosed in Table 4 are poured into the frames, respectively. Then, each of the compositions was irradiated with one M rad dose of electron beam which had an energy of 250 KeV and had the beam-density of 50 $\mu A/cm^2$ at the surface of the composition. The results of the measurements on the thicknesses, surface specific resistances and volume specific resistances which were carried out in same manner as the former Examples, are shown in the following Table 4.

In Table 4, the abbreviations for the components of the compositions are the same as those in the foregoing Table 3.

TABLE 4

| | Composition | | | Film Thickness (mm) | Electric Resistance | |
|---|---|---|---|---|---|---|
| | | | | | Surface Specific Resistance (ohm) | Volume Specific Resistance (ohm·cm) |
| Example | A | B | C | | | |
| 61 | Phosmer-Cl (3.5g) | AUT-400E(5.2g) | Ethyl acrylate (1.3g) | 0.10 | $2.7\times10^7$ | $6.8\times10^6$ |
| 62 | Phosmer-Cl (5.0g) | AUT-400E(4.0g) | Ethyl acrylate (1.0g) | 0.12 | $1.8\times10^5$ | $1.2\times10^5$ |
| 63 | Phosmer-M (5.0g) | AUT-400E(4.0g) | Ethyl acrylate (1.0g) | 0.10 | $6.0\times10^4$ | $2.4\times10^5$ |
| 64 | Phosmer-Cl (3.5g) | NK-14G (5.2g) | Vinyl acetate (1.3g) | 0.11 | $8.3\times10^4$ | $3.3\times10^5$ |

TABLE 4-continued

| Example | Composition A | B | C | Film Thickness (mm) | Electric Resistance Surface Specific Resistance (ohm) | Electric Resistance Volume Specific Resistance (ohm·cm) |
|---|---|---|---|---|---|---|
| 65 | Phosmer-Cl (5.0g) | NK-14G (4.0g) | Vinyl acetate (1.0g) | 0.18 | $3.5 \times 10^4$ | $2.5 \times 10^5$ |
| 66 | Phosmer-M (3.5g) | NK-14G (5.2g) | Vinyl acetate (1.3g) | 0.11 | $6.4 \times 10^4$ | $1.9 \times 10^5$ |
| 67 | Phosmer-M (5.0g) | NK-14G (4.0g) | Vinyl acetate (1.0g) | 0.12 | $2.3 \times 10^4$ | $8.7 \times 10^4$ |
| 68 | Phosmer-M (2.5g) | AUT-400E(3.2g) NK-14G (2.0g) | Ethyl acrylate (0.8g) Vinyl acetate (0.5g) | 0.16 | $2.1 \times 10^5$ | $5.1 \times 10^5$ |
| 69 | SEM (0.3g) | AUT-400E(1.36g) | Ethyl acrylate (0.34g) | 0.15 | $4.2 \times 10^4$ | $3.9 \times 10^5$ |
| 70 | SEM (0.1g) | AUT-400E(1.52g) | Ethyl acrylate (0.38g) | 0.19 | $1.2 \times 10^4$ | $2.7 \times 10^5$ |
| 71 | SEM (0.3g) | NK-14G (1.36g) | Vinyl acetate (0.34g) | 0.22 | $3.8 \times 10^4$ | $2.7 \times 10^5$ |

EXAMPLE 72

In this example, the relation between the relative humidity and the electric conductivity of the electroconductive resin was measured.

A composition comsisting of:

| | |
|---|---|
| phosmer-M | 5.0g, |
| AUT-1000E | 5.0g (both aforementioned), |
| benzoin ethyl ether | 0.1g as the photosensitizer, and |
| acetone | 5.0g as the solvent | was mixed well, and poured on the mercury layers in Petri dishes (10 cm in diameter and 1.5 cm in depth) like those in the foregoing Examples 1 to 60. The foams and the solvent in the composition were then removed.

Thereafter, the actinic rays were irradiated to the above samples in the same manner as in the foregoing Examples 1 to 60 for 5 minutes. Each electric resistance was measured in air having the following respective relative humidites (20%, 50% and 79.2%), in which the temperature was kept at 20° C, and the result of which is shown in the following Table 5. The thicknesses of the formed films were 0.87 mm.

TABLE 5

| Relative Humidity | 20% | 50% | 79.2% |
|---|---|---|---|
| Surface specific Resistance (ohm) | $2.5 \times 10^5$ | $4.1 \times 10^4$ | $2.1 \times 10^4$ |
| Volume Specific Resistance (ohm·cm) | $4.1 \times 10^5$ | $8.1 \times 10^4$ | $1.3 \times 10^4$ |

Controllings of the relative humidities was carried out through the following methods.

a. Relative humidity: 20%

The Petri dish was placed in a desiccator which contained a saturated aqueous solution of $CH_3COOK$ (potassium acetate).

b. Relative humidity: 50%

The sample was left intact in the laboratory wherein the relative humidity was 50% and the temperature was 20° C.

c. Relative humidity: 79.2%

The samples was placed in a desiccator which contained a saturated aqueous solution of $NH_4Cl$ (ammonium chloride).

As will be understood from the above results, the electroconductive resin of the present invention is not susceptible to the change of the relative humidity, for example, the electric resistance at R.H. 50% is only two or six times as compared with the value at R.H. 79.2%.

What is claimed is:

1. An electroconductive composition which comprises:

A. at least one alkylene phosphoric ester, alkylene phosphate ester, alkylene sulfonic ester or alkylene sulfonate of acrylic acid or methacrylic acid, represented by the following formulae:

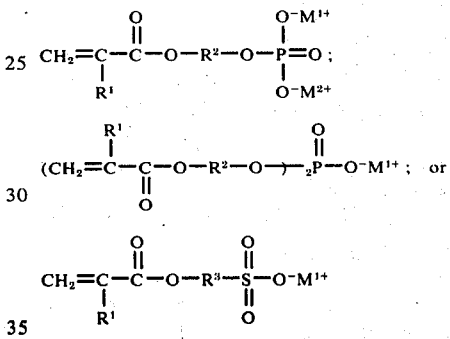

in which $R^1$ is hydrogen or a methyl group, $R^2$ is an alkylene group having 1 to 4 carbon atoms, $R^3$ is an alkylene group having 1 to 5 carbon atoms, and each $M^1$ and $M^2$ is hydrogen, a monovalent metal, ammonium or monoamine, and B. unsaturated polyester of acrylic acid, methacrylic acid, α-chloroacrylic acid or α-bromoacrylic acid, and polyhydric alcohol having 2 to 4 hydroxyl groups, said polyester having at least two polymerizable ethylenically unsaturated groups.

2. A composition as claimed in claim 1, in which said alkylene phosphoric ester of acrylic acid or methacrylic acid is a member selected from the group consisting of phosphoric ethylene acrylate, phosphoric ethylene methacrylate, phosphoric trimethylene acrylate, phosphoric isopropylene methacrylate, phosphoric trimethylene methacrylate, phosphoric tetramethylene methacrylate, phosphoric 1-chloromethylethylene methacrylate, phosphoric-bis-(-ethylene acrylate), phosphoric-bis-(-ethylene methacrylate), phosphoric-bis-(-trimethylene acrylate), phosphoric bis-(-isopropylene methacrylate), phosphoric-bis-(-trimethylene methacrylate), phosphoric-bis-(-tetramethylene acrylate) and phosphoric bis-(-tetramethylene methacrylate).

3. A composition as claimed in claim 1, in which said alkylene sulfonic ester of acrylic acid or methacrylic acid is a member selected from the group consisting of sulfomethylene acrylate, sulfoethylene acrylate, sulfoethylene methacrylate, sulfotrimethylene acrylate, sulfoisopropylene acrylate, sulfotrimethylene methacrylate, sulfotetramethylene acrylate, sulfobutylene methacrylate and sulfopentamethylene acrylate.

4. A composition as claimed in claim 1, in which said alkylene phosphate ester or alkylene sulfonate ester of acrylic acid or methacrylic acid is an ester prepared by neutralizing the alkylene phosphoric ester or the alkylene sulfonic ester of acrylic acid or methacrylic acid with inorganic or organic base.

5. A composition resin as claimed in claim 4, in which said inorganic base is at least one monovalent metallic base selected from the group consisting of sodium hydroxide, lithium hydroxide, potassium hydroxide and silver perchlorate.

6. A composition as claimed in claim 4, in which said organic base is at least one aliphatic or cyclic monoamine selected from the group consisting of monoethyl amine, dimethyl amine, trimethyl amine, monoethyl amine, diethyl amine, triethyl amine, n-butyl amine, monoethanol amine, diethanol amine, triethanol amine, pyridine, aniline, morpholine and piperidine.

7. A composition as claimed in claim 1, in which the amount of said ester is in the range of 5 to 95% by weight.

8. A composition as claimed in claim 1, in which said polyhydric alcohol having two to four hydroxyl groups is at least one member selected from the group consisting of ethylene glycol, diethylene glycol, triethylene glycol, neopentyl glycol, polyethylene glycol, propylene glycol, polypropylene glycol, trimethylol propane, glycerine and pentaerythritol.

9. A composition as claimed in claim 1, in which said unsaturated polyester is prepared by reacting 1.0 equivalent of the carboxylic group of said acids with 1.0 to 2.0 equivalent of the hydroxyl group of the polyhydric alcohol having two to four of hydroxyl groups.

10. A composition as claimed in claim 1 further comprising:
C. at least one polymeric film-forming agent selected from the group consisting of polyvinylalcohol; copolymer of N-vinylpyridine, butyl methacrylate and vinyl acetate; butyral resin; copolymer of vinyl chloride and vinyl acetate; copolymer of acrylic acid and methyl methacrylate; copolymer of 2-hydroxyethylacrylate, methyl methacrylate and butyl acrylate; cellulose ester, cellulose ether, and cellulose-ester-ether, D. at least one polymericable ethylenically unsaturated compound selected from the group consisting of:
a. styrene and its derivatives of the formula:

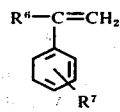

in which $R^6$ is hydrogen or methyl and $R^7$ is hydrogen, methyl or chlorine, b. acrylic or methacrylic monomers of the formula:

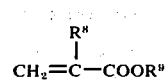

in which $R^8$ is hydrogen or methyl, and $R^9$ is hydrogen, alkyl of 1 to 16 carbon atoms, hydroxyalkyl group of 2 to 3 carbon atoms, glycidyl group and dialkylamino alkyl group

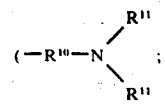

in which $R^{10}$ is alkylene of 1 to 2 carbon atoms and $R^{11}$ is alkyl of 1 to 2 carbon atoms) and c. vinylidene compounds of the formula:

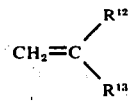

in which $R^{12}$ is hydrogen or methyl, and $R^{13}$ is nitrile, carbomoyl, N-methylocarbamoyl, alkylether-N-methylolcarbamoyl ($-CONHCH_2OR^{14}$, in which $R^{14}$ is alkyl of 1 to 4 carbon atoms) or acetoxy, and E. a polymerication initiator.

* * * * *